United States Patent
Kuroda et al.

[11] Patent Number: 5,837,565
[45] Date of Patent: Nov. 17, 1998

[54] SEMICONDUCTOR DEVICE

[75] Inventors: Takao Kuroda, Kokubunji; Yasuhiro Shiraki, Hino, both of Japan

[73] Assignee: Hitachi, Ltd., Tokyo, Japan

[21] Appl. No.: 450,621

[22] Filed: May 25, 1995

Related U.S. Application Data

[62] Division of Ser. No. 235,155, Apr. 28, 1994, which is a continuation of Ser. No. 863,471, Apr. 2, 1992, abandoned, which is a continuation of Ser. No. 528,898, May 29, 1990, abandoned, which is a continuation of Ser. No. 316,658, Feb. 28, 1989, abandoned, which is a continuation of Ser. No. 56,294, May 29, 1987, abandoned, which is a continuation of Ser. No. 745,226, Jun. 17, 1985, abandoned.

[30] Foreign Application Priority Data

Jun. 18, 1984 [JP] Japan ........................... 6-123606

[51] Int. Cl.$^6$ ........................... H01L 21/20; H01L 21/338
[52] U.S. Cl. ........................... 438/172; 438/938
[58] Field of Search ........................... 257/18, 20, 24, 257/190, 192, 194; 438/172, 938

[56] References Cited

U.S. PATENT DOCUMENTS 4,163,237 7/1979 Dingle et al. ........................... 257/20
4,663,643 5/1987 Mimura ........................... 257/195
4,797,716 1/1989 Chaffin et al. ........................... 257/18

OTHER PUBLICATIONS

T.E. Zipperian, et al., "An $In_{0.2}Ga_{0.8}As/GaAs$, Modulation–Doped, Strained–layer Superlattice Filed–Effect Transistor", Electron Devices Meeting, Dec. 1983, pp. 696–699.

*Primary Examiner*—John Guay
*Attorney, Agent, or Firm*—Antonelli, Terry, Stout & Kraus, LLP

[57] ABSTRACT

Disclosed is a semiconductor device comprising an undoped GaAs layer, an intermediate undoped layer and an undoped $Ga_{1-x}Al_xAs$ layer which are successively provided on a substrate made of a semiinsulating GaAs crystal; the intermediate undoped layer being an undoped $In_yGa_{1-y}As$ layer, an undoped $GaAs_{1-z}Sb_z$ layer, a superlattice layer which includes an undoped $In_yGa_{1-y}As$ layer and an undoped $GaAs_{1-z}Sb_z$ layer, a superlattice layer which includes an undoped $In_yGa_{1-y}As$ layer and an undoped GaAs layer, or a superlattice layer which includes an undoped $GaAs_{1-z}Sb$ layer and an undoped GaAs layer. When applied to a high electron mobility transistor, this semiconductor device affords a high current and a high speed and has the merit of a small dispersion in the threshold voltage thereof.

10 Claims, 2 Drawing Sheets

SEMICONDUCTOR DEVICE

This application is a divisional of application Ser. No. 08/235,155, filed Apr. 28, 1994, which is a continuation of application Ser. No. 07/863,471, filed Apr. 2, 1992, and now abandoned, which is a continuation of application Ser. No. 07/528,898, filed May 29, 1990, now abandoned, which is a continuation of application Ser. No. 07/316,658, filed Feb. 28, 1989, now abandoned, which is a continuation of application Ser. No. 07/056,294, filed May 29, 1987, now abandoned, which is a continuation of application Ser. No. 06/745,226, filed Jun. 17, 1985, now abandoned.

BACKGROUND OF THE INVENTION

The present invention relates to a semiconductor device which utilizes a two-dimensional electron gas appearing at the heterojunction of compound semiconductors, and more particularly to a high electron mobility transistor.

While aiming at applications to a high speed computer and a high speed signal processing system, the developments of ICs and LSIs employing GaAs and InP of high electron mobilities have been promoted. In particular, regarding a high electron mobility transistor (hereinbelow, abbreviated to "HEMT") which exploits the high speed property of a two-dimensional electron gas appearing at the heterojunction between GaAs and GaAlAs, InP and InGaAs, or the like, it has become possible to fabricate one whose switching time per gate is 12 psec at room temperature.

Fig. 1a shows a sectional view of a typical HEMT. In the figure, numeral 1 designates a semi insulating GaAs substrate, numeral 2 an undoped GaAs layer of high purity which has a thickness of approximately 1 $\mu$m and a carrier density of at most $10^{14}$ cm$^{-3}$, numeral 3 a $Ga_{1-x}Al_xAs$ layer ($x$ being about 0.3) which has a thickness of approximately 100 Å, numeral 4 an n-$Ga_{1-x}Al_xAs$ layer ($x$ being about 0.3) which has a thickness of approximately 500 Å and a carrier density of $10^{17}$–$10^{18}$ cm$^{-3}$, numeral 5 a two-dimensional electron gas layer which is induced at the heterojunction between the undoped GaAs layer 2 and the undoped $Ga_{1-x}Al_xAs$ layer 3 within the undoped GaAs layer, numeral 6 a source electrode in the case of fabricating a field effect transistor (hereinbelow, written "FET"), numeral 7 a gate electrode, numeral 8 a drain electrode, numeral 9 a source, and numeral 10 a drain. Semiconductor crystals for such HEMT are prepared by a molecular beam epitaxy method (hereinbelow, written "MBE method") or an organo-metallic vapor phase epitaxy method (OM-VPE method).

FIG. 1b is an energy band structure diagram of the HEMT shown in FIG. 1a. In each of FIGS. 1b, 2b and 3b, the axis of ordinates represents the level of energy, while the axis of abscissas represents the position of a corresponding semiconductor device in the depthwise direction thereof. In each figure, symbol $E_C$ denotes a conduction band, symbol $E_F$ a Fermi level, symbol $E_V$ a valence band, symbol $E_S$ a channel, and symbol W a potential well. The other symbols denote parts similar to those in FIG. 1a.

Since the two-dimensional electron gas runs in the undoped GaAs layer 2 of high purity, such HEMT has high mobility of at least 8000 cm$^2$/V•sec at room temperature and exhibits a large number of excellent characteristics such as the high speed property of the element. In the case of fabricating the FET, however, the sheet density of the two-dimensional electron gas is on the order of $10^{11}$ cm$^{-2}$, and the two-dimensional electron gas is confined within a thickness of only 100 Å from the interface of the heterojunction, so that current flow cannot be enlarged. This leads to the disadvantage common to FETs that the high speed property of the element degrades in case of a large fan-out. Moreover, when the width L of the gate electrode diminishes to the order of submicrons, the threshold voltage $V_{th}$ tends to lower due to the short channel effect. That is, as compared with a conventional GaAs FET (MESFET), the HEMT is somewhat advantageous in the aspect of the high speed property of the element because electrons are confined (the channel $E_S$) in the triangular well W of the potential at the interface. However, when L becomes approximately 0.5 $\mu$m, the dispersion of $V_{th}$ enlarges accordingly, which poses a serious problem.

To the end of improving these drawbacks, a HEMT of double hetero-structure as shown in FIGS. 2a and 2b has been proposed. FIG. 2a is a sectional view of this HEMT, while FIG. 2b is an energy band structure diagram. In the respective figures, numerals 21 and 23 designate undoped GaAs layers, numeral 22 an undoped $Ga_{1-x}Al_xAs$ layer, and numeral 5' a two-dimensional electron gas layer which is induced in the undoped GaAs layer 23. The other symbols denote parts similar to those in Figs. 1a and 1b. In this HEMT, the two-dimensional electron gas layer 5' is held between the undoped $Ga_{1-x}Al_xAs$ layer 3 and the undoped $Ga_{1-x}Al_xAs$ layer 22 provided on the substrate side, and electrons are confined in the potential well W formed by them. In this case, when the mol ratio $x$ of AlAs in the undoped $Ga_{1-x}Al_xAs$ layer 22 is set at 0.1–0.3 necessary for the confinement of the electrons, the width of the potential well W of the undoped GaAs layer 23 held between the layers 3 and 22 will spread to about 200 Å by way of example. It is therefore expected that the sheet density of carriers will be permitted to increase near to double the past value, and that the short channel effect will lessen.

In actuality, however, the electron mobility of the HEMT shown in FIGS. 2a and 2b became lower than that of the device shown in Figs. 1a and 1b for the reason that the undoped GaAs layer 23 grown on the undoped $Ga_{1-x}Al_xAs$ layer 22 worsened in crystallinity or crystalline soundness.

The following references are cited to show the state of the art;

i) Official Gazette of Japanese Patent Application Laying-open No. 56-94780, ii) Official Gazette of Japanese Patent Application Laying-open No. 57-76879.

SUMMARY OF THE INVENTION

An object of the present invention is to provide a high electron mobility semiconductor device of a new structure free from the difficulties of the prior art described above.

In order to accomplish the object, the semiconductor device of the present invention comprises an undoped GaAs layer, an intermediate undoped layer and an undoped $Ga_{1-x}Al_xAs$ layer which are provided on a substrate in the order mentioned; the intermediate undoped layer being an undoped $In_yGa_{1-y}As$ layer, an undoped $GaAs_{1-z}Sb_z$ layer, a superlattice layer which is formed by stacking at least one undoped $In_yGa_{1-y}As$ layer and at least one undoped $GaAs_{1-z}Sb_z$ layer, a superlattice layer which is formed by stacking at least one undoped $In_yGa_{1-y}As$ layer and at least one undoped GaAs layer, or a superlattice layer which is formed by stacking at least one undoped $GaAs_{1-z}Sb_z$ layer and at least one undoped GaAs layer. The values of $x$, $y$ and $z$ mentioned above are set to be at most 1 and to be greater than 0. Owing to the above construction, a two-dimensional electron gas is confined in the intermediate undoped layer. By utilizing the two-dimensional electron gas as carriers contributive to the operation of the semiconductor device, it-is possible to fabricate a FET, a CCD, etc. which operate at high speed. In a practicable form of the semiconductor device, for example, the FET, an n-$Ga_{1-x}Al_xAs$ layer which is an n-type semiconductor layer is formed on the aforementioned $Ga_{1-x\ Al_x}As$ layer, and a source region, a drain region, a source electrode, a drain electrode and a gate electrode are provided.

The thickness of the aforementioned intermediate undoped layer is set at 50–500 Å, preferably 100–200 Å. In a case where the thickness of the intermediate undoped layer exceeds the above range, the misfit dislocation arises and the electron mobility tends to lower, and in a case where it is less than the range, the quantity of confinement of the two-dimensional electron gas decreases, so that both the cases are unfavorable. Besides, in the case where the intermediate undoped layer is the superlattice layer, a thickness up to 1000 Å can be used.

As stated before, the values $\underline{x}$, $\underline{y}$ and $\underline{z}$ are not greater than 1 and are greater than 0. More preferably, the value $\underline{x}$ is set at 0.1–0.5, and the values $\underline{y}$ and $\underline{z}$ are set at 0.05–0.5. Crystals of compositions whose values $\underline{x}$, $\underline{y}$ and $\underline{z}$ fall within these ranges are convenient because the crystal growth is easy.

The substrate is such that at least its surface for forming the undoped GaAs layer thereon permits the growth of a GaAs crystal and is made of a semiinsulating or insulating material. Usually, a semiinsulating GaAs crystal commercially available can be employed.

BRIEF DESCRIPTION OF THE DRAWINGS

FIG. 1a is a sectional view of a typical HEMT in the prior art, while FIG. 1b is an energy band structure diagram of the HEMT shown in FIG. 1a;

FIG. 2a is a sectional view of an improved HEMT in the prior art, while FIG. 2b is an energy band structure diagram of the HEMT shown in FIG. 2a; and FIG. 3a is a sectional view of a HEMT which is one embodiment of the present invention, while FIG. 3b is an energy band structure diagram of the HEMT shown in FIG. 3a.

DESCRIPTION OF THE PREFERRED EMBODIMENT

Figure 1A:
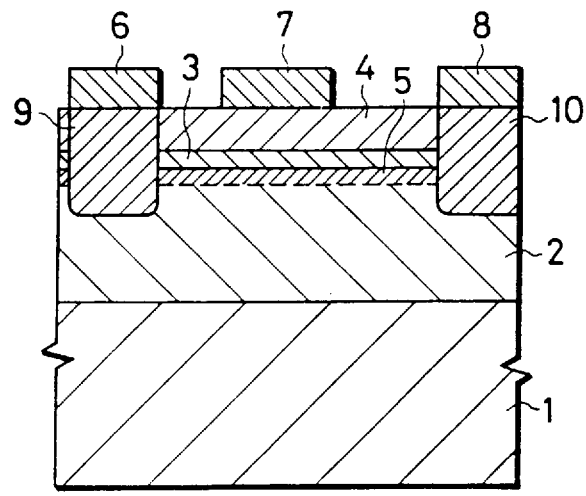
Figure 1B:
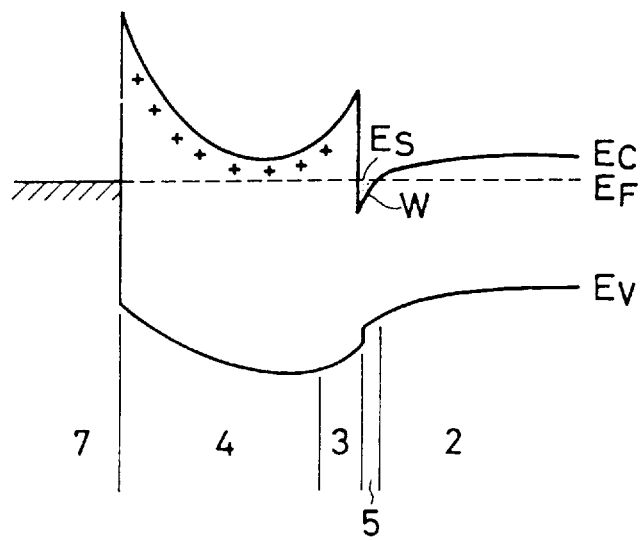
Figure 2A:
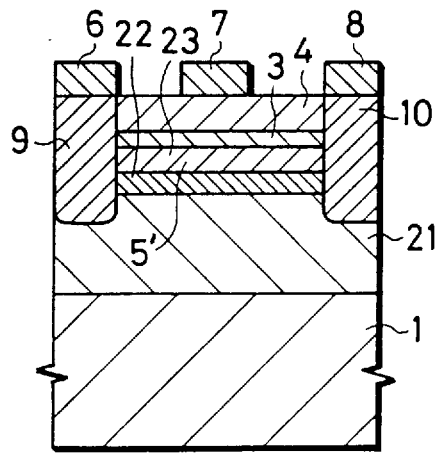
Figure 2B:
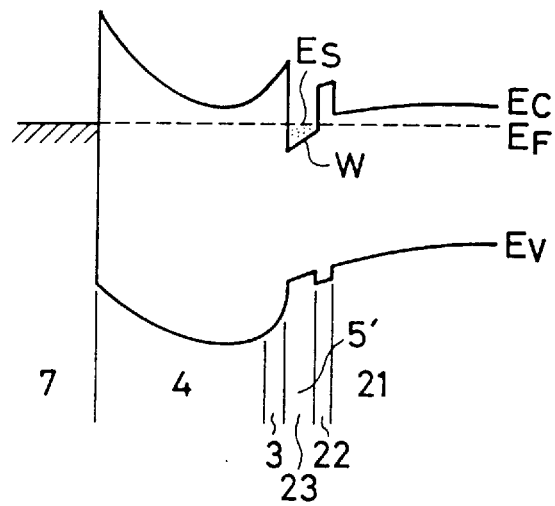
Figure 3A:
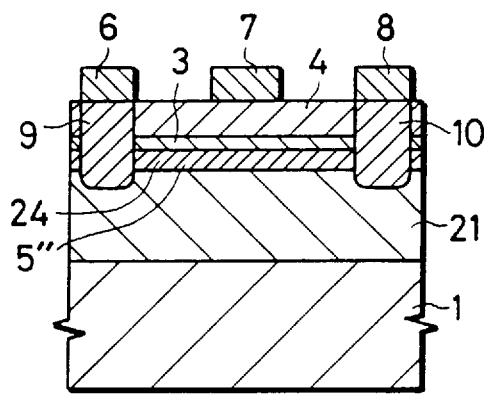
Figure 3B:
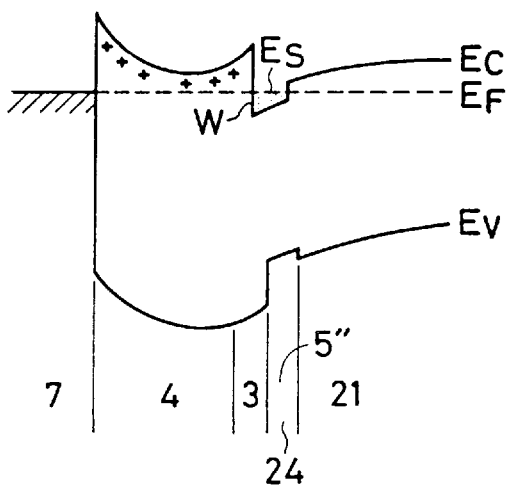

The structure of a HEMT embodying the present invention is shown in FIGS. 3a and 3b. FIG. 3a is a sectional view of the HEMT of the present embodiment, while FIG. 3b is an energy band structure diagram thereof.

As shown in these figures, in the HEMT of the present embodiment, a two-dimensional electron gas layer 5" is confined in the potential well W of an undoped $In_yGa_{1-y}As$ layer (y>0) 24 approximately 200 Å wide, the layer 24 being an intermediate undoped layer which is held between the undoped GaAs layer 21 on the substrate side and the undoped $Ga_{1-x}Al_xAs$ layer (x>0) 3 on the front surface side. As the intermediate undoped layer, the undoped $In_yGa_{1-y}As$ layer 24 may well be replaced with an undoped $GaAs_{1-z}Sb_z$ layer (z>0), or at least one undoped $In_yGa_{1-y}As$ layer and at least one undoped $GaAs_{1-z}Sb_z$ layer may well be provided in stacked fashion. It is also allowed to employ a superlattice structure which consists of the two layers of an undoped GaAs layer and an undoped $In_yGa_{1-y}As$ layer or the two layers of an undoped GaAs layer and an undoped $GaAs_{1-z}Sb_z$ layer. Further, the respective two layers mentioned above may well be provided in multistage fashion. The band gap difference between the undoped GaAs layer 21 and the ternary mixed crystal (in FIG. 3a, the undoped $In_yGa_{1-y}As$ layer 24) becomes about 0.1 eV when $\underline{y}$ and $\underline{z}$ are about 0.1, and it becomes about 0.2 eV when $\underline{y}$ and $\underline{z}$ are about 0.2. The values are sufficient for forming the well.

The structure shown in FIG. 3a can be readily fabricated using, for example, the molecular beam epitaxy under almost the same growth conditions as those of the prior-art HEMT and by adding a vaporization crucible for In or Sb to a producing apparatus anew. Now, a method of manufacturing the HEMT of the present embodiment will be explained.

1. First, a semiinsulating GaAs substrate 1 having the crystal orientation <100> is inserted into an MBE apparatus which is furnished with vaporization crucibles being the molecular beam sources of Ga, As, In, Al and Si.

2. Next, the substrate is heated to approximately 630° C. to clean the surfaces thereof.

3. While the temperature of the substrate is held at approximately 600° C., the shutters of the molecular beam sources of Ga and As are opened, and an undoped GaAs layer 21 having a thickness of approximately 1μm is grown. In an example, the intensity ratio between the molecular beams Ga and As at that time was 1:2.

4. Subsequently, the shutter of the molecular beam source of In is opened, and an undoped $In_yGa_{1-y}As$ layer 24 having a thickness of approximately 200 Å is grown.

5. Subsequently, the shutter of the molecular beam source of In is closed, the shutter of the molecular beam source of Al is opened, and an undoped $Ga_{1-x}Al_xAs$ layer 3 having a thickness of approximately 100 Å is grown.

6. At the next step, the shutter of the molecular beam source of Si is opened, and a well-known n-$Ga_{1-x}Al_xAs$ layer 4 having a thickness of approximately 1000 Å is grown.

7. All the molecular bean sources except that of As have their shutters closed, and the substrate temperature is lowered.

8. An Au-12 wt. % Ge alloy is evaporated on the regions of a source and a drain to a thickness of 0.2 μm and is heated at 450° C. for 3 minutes so as to give rise to thermal diffusion, whereby Au-12 wt. % Ge is caused to permeate down to the undoped GaAs layer 21 until the source portion and the drain portion are alloyed.

9. A source electrode, a drain electrode and a gate electrode are provided. Then, the HEMT is finished up.

Although, in the present embodiment, the electrodes are mounted directly on the n-$Ga_{1-x}Al_xAs$ layer 4, they are sometimes installed through insulator layers.

In the example, the undoped $In_yGa_{1-y}As$ layer 24 did not degrade in quality when grown on the undoped GaAs layer 21. As compared with an undoped GaAs layer, the layer 24 has the mobility slightly lowered by the alloy scattering, but the lowered component is, in effect, canceled by increasing the sheet electron density and a raised speed can be achieved as an IC. This undoped $In_yGa_{1-y}As$ layer 24 has a lattice constant greater than that of the underlying undoped GaAs layer 21 or the overlying undoped $Ga_{1-x}Al_xAs$ layer 3, and hence, when it is too thick, a misfit dislocation arises at the interface. In this regard, the occurrence of the dislocation was not observed up to a thickness of 200 Å. The above facts were similar when an undoped $GaAs_{1-z}Sb_z$ was used in place of the undoped $In_yGa_{1-y}As$ layer 24.

Besides, in a case where the undoped $In_yGa_{1-y}As$ layer 24 as the intermediate undoped layer was replaced with undoped $In_yGa_{1-y}As$ layers or undoped $GaAs_{1-z}Sb_z$ layers alternating with undoped GaAs layers, each of the layers being about 50 Å thick, the misfit dislocation did not arise up to a total thickness of 1000 Å, and the effective sheet density could be increased more.

Since the electron mobilities of high-purity GaAs, InAs and GaSb at the room temperature are about 8500, 33000 and 5000 cm$^2$/V•sec respectively, it is needless to say that the mixed crystal (GaIn)As is more advantageous than Ga(AsSb) as the material of the layer (24 in FIG. 3a) for confining the two-dimensional electron gas layer 5". In general, a HEMT of higher speed can be realized in case of employing $In_yGa_{1-y}As$ than in case of employing GaAs, but the mobilities of InGaAs and GaAs are not considerably different for $0 \leq y \leq 0.25$. For y <0.3, the mobility rises substantially rectilinearly toward the value of InAs, but the lattice misfit increases, too. Therefore, it is more desirable to dispose InGaAs or GaAsSb alternately with undoped GaAs.

In FIGS. 3a and 3b showing the present embodiment, symbols not referred to above correspond to those in the other figures.

As compared with the prior-art HEMT, the HEMT obtained in accordance with the present embodiment afforded a greater current value, a higher speed, and a smaller dispersion of the threshold voltage $V_{th}$. Further, degradation in quality attributed to an inferior crystallinity or crystalline soundness was not observed.

While the foregoing is the application to the FET, the present invention is also effective for other elements utilizing the characteristics of the two-dimensional electron gas, such as a CCD (Charge Coupled Device).

In the semiconductor device of the present invention, matters not described in this specification may be resorted to previous knowledge in the technical field concerned.

Obviously many modifications and variations of the present invention are possible in the light of the above teachings. It is therefore to be understood that within the scope of the appended claims the invention may be practiced otherwise than as specifically described.

What is claimed is:

1. A method of manufacturing a semiconductor device having a field-effect transistor structure, comprising the steps of:
    forming a substantially undoped GaAs layer on a semi-insulating GaAs substrate;
    forming a substantially undoped $In_yGa_{1-y}As$ layer on the undoped GaAs layer, where y is greater than 0 and up to 1, said $In_yGa_{1-y}As$ layer having a thickness in a range of 100–200 Å;
    forming a substantially undoped $Ga_{1-x}Al_xAs$ layer on the undoped $In_yGa_{1-y}As$ layer, where x is greater than 0 and up to 1;
    forming an n-type $Ga_{1-x}Al_xAs$ layer over said substantially undoped $Ga_{1-x}Al_xAs$ layer; and
    forming a gate electrode so as to apply voltage to said substantially undoped $In_yGa_{1-y}As$ layer via said n-type $Ga_{1-x}Al_xAs$ layer.

2. The method according to claim 1, wherein the undoped GaAs layer, the undoped $In_yGa_{1-y}As$ layer, the undoped $Ga_{1-x}Al_xAs$ layer, and the n-type $Ga_{1-x}Al_xAs$ layer are each formed by molecular beam epitaxy.

3. The method according to claim 1, further comprising a step of forming source and drain portions extending from the n-type $Ga_{1-x}Al_xAs$ layer through the substantially undoped $In_yGa_{1-y}As$ layer to the undoped GaAs layer except for a portion below said gate electrode.

4. The method according to claim 3, further comprising a step of forming source and drain electrodes above said n-type $Ga_{1-x}Al_xAs$ layer, wherein said source and drain portions are formed as alloyed regions under said source and drain electrodes.

5. A method of manufacturing a semiconductor device according to claim 1, wherein y of said $In_yGa_{1-y}As$ is in a range of 0.05 to 0.5.

6. A method of manufacturing a semiconductor device according to claim 1, wherein said GaAs layer is formed epitaxially on said semi-insulating GaAs substrate, said $In_yGa_{1-y}As$ layer is formed epitaxially on said GaAs layer, and said $Ga_{1-x}Al_xAs$ layer is formed epitaxially on the $In_yGa_{1-y}As$ layer, respectively.

7. A method of manufacturing a semiconductor device according to claim 6, wherein the epitaxial processes for GaAs, $In_yGa_{1-y}As$, and $Ga_{1-x}Al_xAs$ layers utilize molecular beam epitaxy.

8. A method of making a semiconductor device having a field-effect transistor structure with a potential well confining a two-dimensional electron gas, comprising the steps of:
    forming an undoped first semiconductor layer, having a first lattice constant, on a semi-insulating semiconductor substrate;
    forming a second semiconductor layer, having a thickness in a range of 100–200 Å, having a second lattice constant greater than that of the first semiconductor layer, and being substantially undoped, on the first semiconductor layer;
    forming a third semiconductor layer, which has a third lattice constant smaller than that of the second semiconductor layer and which includes an n-type region therein, on the second semiconductor layer; and
    forming an electrode so as to apply voltage therefrom to said second semiconductor layer via said n-type region,
    wherein material of said third semiconductor layer is selected so as to form a two-dimensional electron gas in said second semiconductor layer, and material of said first semiconductor layer is selected so as to confine said two-dimensional electron gas in said second semiconductor layer as a potential well, and wherein the first semiconductor layer is made of GaAs, the second semiconductor layer is made of a material selected from the group consisting of $In_xGa_{1-x}As$ and $GaAs_{1-y}Sb_y$, and the third semiconductor layer is made of $Al_zGa_{1-z}As$, wherein z is at most 1 but greater than 0 and x and y are each in a range of 0.05 to 0.5.

9. A method of fabricating a semiconductor device having a field-effect transistor structure, comprising the steps of:
    forming a second semiconductor layer, substantially undoped, on an undoped first semiconductor layer, a material of said second semiconductor layer having a smaller band gap than that of said undoped first semiconductor layer and a different lattice constant from that of said undoped first semiconductor layer, and said second semiconductor layer having a thickness in a range of 100–200 Å;
    forming a third semiconductor layer including an n-type region on said second semiconductor layer, a material of said third semiconductor layer having a larger band gap than that of said second semiconductor layer; and
    forming an electrode so as to apply voltage therefrom to said second semiconductor layer through said n-type region,
    wherein the first semiconductor layer is made of GaAs, the second semiconductor layer is made of a material selected from the group consisting of $In_xGa_{1-x}As$ and $GaAs_{1-y}Sb_y$, and the third semiconductor layer is made of $Al_zGa_{1-z}As$, wherein z is at most 1 but greater than 0, and x and y are each in a range of 0.05 to 0.5.

10. A method of fabricating a semiconductor device having a field-effect transistor structure, including steps of:

forming an undoped first semiconductor layer epitaxially on a semi-insulating semiconductor substrate;

forming a second semiconductor layer, substantially undoped, epitaxially on said undoped first semiconductor layer, a material of said second semiconductor layer having a smaller bandgap than that of said undoped first semiconductor layer and a different lattice constant from that of said undoped first semiconductor layer, and said second semiconductor layer having a thickness in a range of 100–200 Å;

forming a third semiconductor layer, including an n-doped portion, epitaxially on said second semiconductor layer, a material of said third semiconductor layer having a larger bandgap than that of said second semiconductor layer; and forming a gate electrode so as to apply an electric field to said second semiconductor layer through said n-doped portion, wherein the semi-insulating semiconductor substrate and the undoped first semiconductor layer are made of GaAs, the second semiconductor layer is made of a material selected from the group consisting of $In_xGa_{1-x}As$ and $GaAs_{1-y}Sb_y$, and the third semiconductor layer is made of $Al_zGa_{1-z}As$ respectively, and z is at most 1 but greater than 0, and x and y and are each in a range of 0.05 to 0.5.

* * * * *